(12) United States Patent
Sowlati et al.

(10) Patent No.: US 7,711,327 B2
(45) Date of Patent: *May 4, 2010

(54) DIRECT CONVERSION RECEIVER HAVING A SUBHARMONIC MIXER

(75) Inventors: Tirdad Sowlati, Irvine, CA (US); Rajasekhar Pullela, Colton, CA (US); Dmitriy Rozenblit, Irvine, CA (US)

(73) Assignee: Skyworks Solutions, Inc., Woburn, MA (US)

(*) Notice: Subject to any disclaimer, the term of this patent is extended or adjusted under 35 U.S.C. 154(b) by 1091 days.

This patent is subject to a terminal disclaimer.

(21) Appl. No.: 11/369,403

(22) Filed: Mar. 7, 2006

(65) Prior Publication Data

US 2007/0072575 A1     Mar. 29, 2007

Related U.S. Application Data

(63) Continuation-in-part of application No. 11/235,907, filed on Sep. 27, 2005, now Pat. No. 7,483,678.

(51) Int. Cl.
 *H04B 1/38* (2006.01)

(52) U.S. Cl. .......................... 455/73; 455/76; 455/118; 455/127.2

(58) Field of Classification Search .................. 455/69, 455/73, 76, 78, 114.3, 118, 127.2, 313, 318
See application file for complete search history.

(56) References Cited

U.S. PATENT DOCUMENTS

| | | | |
|---|---|---|---|
| 5,511,236 A | 4/1996 | Umstattd et al. |
| 5,631,921 A | 5/1997 | Schilling |
| 5,835,527 A | 11/1998 | Lomp |
| 5,856,766 A | 1/1999 | Gillig et al. |
| 5,890,051 A | 3/1999 | Schlang et al. |
| 5,896,562 A | 4/1999 | Heinonen |
| 5,920,590 A | 7/1999 | Lomp |
| 5,963,583 A | 10/1999 | Davidovici et al. |
| 5,995,538 A | 11/1999 | Lomp |
| 6,002,925 A | 12/1999 | Vu et al. |
| 6,112,061 A | 8/2000 | Rapeli |
| 6,175,586 B1 | 1/2001 | Lomp |
| 6,208,844 B1 | 3/2001 | Abdelgany |
| 6,226,316 B1 | 5/2001 | Schilling et al. |
| 6,397,044 B1 | 5/2002 | Nash et al. |
| 6,591,090 B1 | 7/2003 | Vuorio et al. |
| 6,670,849 B1 | 12/2003 | Damgaard et al. |
| 6,757,261 B1 | 6/2004 | Olgaard et al. |
| 6,795,712 B1 | 9/2004 | Vakilian et al. |
| 6,801,784 B1 | 10/2004 | Rozenblit et al. |
| 6,804,497 B2 | 10/2004 | Kerth et al. |
| 6,879,814 B2 | 4/2005 | Kaikati et al. |
| 6,985,705 B2 | 1/2006 | Shohara |
| 7,003,274 B1 | 2/2006 | Olip |
| 7,058,364 B2 | 6/2006 | Atkinson et al. |
| 7,092,676 B2 | 8/2006 | Abdelgany et al. |
| 7,099,636 B2 | 8/2006 | Rozenblit et al. |

(Continued)

*Primary Examiner*—Nay A Maung
*Assistant Examiner*—Tuan H Nguyen

(57) ABSTRACT

A differential radio frequency (RF) receiver includes a fully differential direct conversion receive chain, a subharmonic mixer in the receive chain, the subharmonic mixer configured to receive a differential radio frequency (RF) input signal and a local oscillator (LO) signal that is phase-shifted by a nominal 45 degrees, and a synthesizer having a voltage controlled oscillator and having at least one frequency divider to generate desired receive LO signals.

14 Claims, 7 Drawing Sheets

U.S. PATENT DOCUMENTS

| | | |
|---|---|---|
| 7,123,664 B2 | 10/2006 | Matero |
| 7,203,472 B2 | 4/2007 | Seppinen et al. |
| 7,218,951 B2 | 5/2007 | Rozenblit et al. |
| 7,242,912 B2 * | 7/2007 | Maligeorgos et al. ......... 455/88 |
| 7,263,334 B2 | 8/2007 | Yip |
| 7,266,352 B2 | 9/2007 | Soe et al. |
| 7,272,366 B2 | 9/2007 | Haapoja et al. |
| 7,280,811 B2 | 10/2007 | Sugiyama et al. |
| 7,356,310 B2 | 4/2008 | Rofougaran et al. |
| 7,356,318 B2 | 4/2008 | Sowlati |
| 2002/0061738 A1 * | 5/2002 | Simmons et al. ......... 455/234.1 |
| 2003/0112895 A1 | 6/2003 | Cook et al. |
| 2003/0176177 A1 | 9/2003 | Molnar et al. |
| 2004/0063419 A1 * | 4/2004 | Molnar et al. ............... 455/323 |
| 2004/0109514 A1 | 6/2004 | Magoon et al. |
| 2004/0121751 A1 | 6/2004 | Shen |
| 2005/0176388 A1 | 8/2005 | Yamawaki et al. |

* cited by examiner

DIRECT CONVERSION RECEIVER HAVING A SUBHARMONIC MIXER

CROSS REFERENCE TO RELATED APPLICATION

This application is a continuation-in-part of U.S. patent application Ser. No. 11/235,907, entitled "Single chip GSM/EDGE Transceiver Architecture With Closed Loop Power Control," filed on Sep. 27, 2005 now U.S. Pat. No. 7,483,678, the entire disclosure of which is incorporated herein by reference.

BACKGROUND

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband TDMA technology, a Gaussian minimum shift keying (GMSK) modulation scheme supplies a clean phase-modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal is both phase modulated (PM) and amplitude modulated (AM). Standards such as these increase the data rate without increasing the bandwidth of the transmitted signal. Unfortunately, existing GSM transmitter hardware is not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

The EDGE communication system attempts to increase the data transmission capability of a GSM communication system by including an amplitude modulation (AM) component in the transmit signal. However, when attempting to add an AM component to the GSM type modulation system, the power control loop will attenuate the amplitude variations present in the signal in an attempt to maintain a constant output power. In such an arrangement, the power control loop tends to cancel the AM portion of the signal.

Further, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

In the past, the transceiver components for such a communication system were typically implemented using multiple devices, also referred to as "chips." However, industry pressures to reduce cost, implementation complexity and power consumption and to extend battery life are driving the industry to attempt single chip architectures. Unfortunately, a single chip implementation for a GSM/EDGE transceiver presents many design challenges, especially in a system in which a closed power control loop is used to control output power of the transmitter. For example, when a closed loop power control system is implemented on the same chip as the transceiver components, the radio frequency (RF) on-chip isolation requirement between the components becomes a major factor affecting transceiver performance.

One of the advances in portable communication technology is the move toward the implementation of a low intermediate frequency (IF) receiver and a direct conversion receiver (DCR). A low IF receiver converts a radio frequency (RF) signal to an intermediate frequency that is lower than the IF of a convention receiver. A direct conversion receiver downconverts a received radio frequency (RF) signal directly to baseband (DC) without first converting the received RF signal to an intermediate frequency (IF). One of the benefits of a direct conversion receiver is the elimination of costly filter components used in systems that employ an intermediate frequency conversion.

A low IF or a direct conversion receiver allows the filter components to be implemented using electronic circuitry that can be located on the same device (i.e., "on-chip") as many of the receiver components. In a direct conversion receiver implementation, high-order (e.g., fifth-order or higher) active filters are used to convert the received signal from RF to DC. Unfortunately, because the filters are implemented using electronic circuitry on the same chip as the receiver components, the filter adds significant noise to the received signal. The added noise reduces the sensitivity of the receiver, thereby making such an active filter challenging to implement.

When converting a received RF signal either to an intermediate frequency signal, or directly to a baseband signal, one or more mixers are used to downconvert the received RF signal. A mixer combines the received RF signal with a reference signals, referred to as a "local oscillator," or "LO" signal. The resultant signal is the received signal at a different, and typically lower, frequency. One mixer technology used today is referred to as a "subharmonic" mixer. A subharmonic mixer uses an LO signal that has a lower frequency, and is typically on the order of one-half of the system LO signal. A subharmonic mixer generally produces lower "self-mixing" components and generally reduces or eliminates feedback to the system antenna. Unfortunately, blocking signals are amplified at the output of the low noise amplifier (LNA) and couple into the mixer core where they are downconverted and corrupt the desired signal at baseband.

In addition, the IP2 (second order intercept point) performance of the receiver is limited and is difficult to improve without the use of IP2 correction methodology, which requires additional area on the chip, increases complexity, and requires manufacturing calibration.

SUMMARY

Embodiments of the invention include a differential radio frequency (RF) receiver comprising a fully differential direct conversion receive chain, a subharmonic mixer in the receive chain, the subharmonic mixer configured to receive a differential radio frequency (RF) input signal and a local oscillator (LO) signal that is phase-shifted by a nominal 45 degrees, and a synthesizer having a voltage controlled oscillator and having at least one frequency divider to generate desired receive LO signals.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
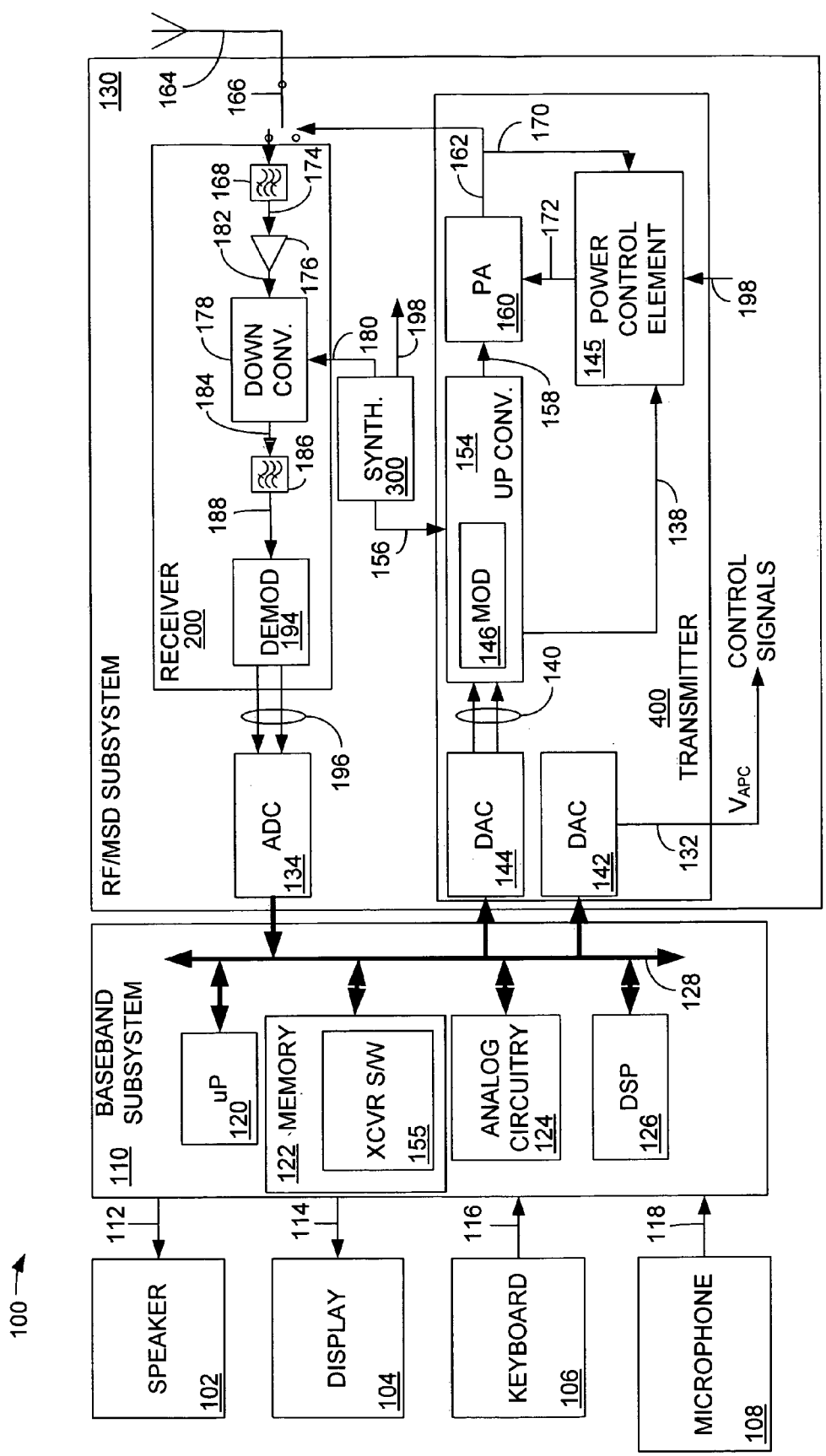
FIG. 1 is a block diagram illustrating a simplified portable transceiver.

Although described with particular reference to a portable transceiver operating the GSM communication system, the direct conversion receiver having a subharmonic mixer can be implemented in any system where it is desirable to have a direct conversion receiver.

The direct conversion receiver having a subharmonic mixer can be implemented in hardware, software, or a combination of hardware and software. When implemented in hardware, the direct conversion receiver having a subharmonic mixer can be implemented using specialized hardware elements and logic. When the direct conversion receiver having a subharmonic mixer is implemented partially in software, the software portion can be used to precisely control the various components in the receiver. The software can be stored in a memory and executed by a suitable instruction execution system (microprocessor). The hardware implementation of the direct conversion receiver having a subharmonic mixer can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the direct conversion receiver having a subharmonic mixer comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor (µP) 120, memory 122, analog circuitry 124, and digital signal processor (DSP) 126 in communication via bus 128. The bus 128, though shown as a single connection, may be implemented using a number of busses connected as necessary among the subsystems within baseband subsystem 110. The microprocessor 120 and the memory 122 provide the signal timing, processing and storage functions for the portable transceiver 100. If portions of the direct conversion receiver having a subharmonic mixer are implemented in software, then the memory 122 also includes transceiver software 155 that can be executed by the microprocessor 120, the DSP 126 or by another processor.

The analog circuitry 124 provides the analog processing functions for the signals within the baseband subsystem 110. The baseband subsystem 110 communicates with the radio frequency (RF)/mixed signal device (MSD) subsystem 130 via the bus 128.

The RF/MSD subsystem 130 includes both analog and digital components. Generally, the RF/MSD subsystem 130 includes a receiver 200, a synthesizer 300 and a transmitter 400. In this example, the RF/MSD subsystem 130 includes an analog-to-digital converter 134, and the transmitter 400 includes one or more digital-to-analog converters (DACS) 142 and 144.

In one embodiment, the baseband subsystem 110 provides an automatic power control signal (supplied as an analog voltage signal and referred to as $V_{APC}$) to the RF/MSD subsystem 130. Although shown as a single connection 132, the control signals may originate from the DSP 126 from the microprocessor 120, or from another element, and are supplied to a variety of points within the RF/MSD subsystem 130 by the DAC 142. It should be noted that, for simplicity, only the basic components of portable transceiver 100 are illustrated.

The ADC 134, the DAC 142 and the DAC 144 also communicate with microprocessor 120, memory 122, analog circuitry 124 and DSP 126 via bus 128. The DAC 144 converts the digital communication information within baseband subsystem 110 into an analog signal for transmission by the transmitter 400 via connection 140. Connection 140, while shown as two directed arrows, includes the information that is to be transmitted by RF/MSD subsystem 130 after conversion from the digital domain to the analog domain.

The DAC 144 may operate on either baseband in-phase (I) and quadrature-phase (Q) components or phase and amplitude components of the information signal. In the case of I and Q signals, the modulator 146 is an I/Q modulator as known in the art while in the case of phase and amplitude components, the modulator 146 operates as a phase modulator utilizing only the phase component and passes the amplitude component, unchanged, to the power control element 145. The DAC 142 supplies various other control signals to various components within the RF/MSD subsystem 130 via connection 132.

The modulator 146 modulates either the I and Q information signals or the phase information signal received from the DAC 144 onto a frequency reference signal referred to as a "local oscillator" or "LO" signal provided by the synthesizer 300 via connection 156. In this example, the modulator 146 is part of the upconverter 154, but need not be.

The modulator 146 also supplies an intermediate frequency (IF) signal containing only the desired amplitude modulated (AM) signal component on connection 138 for input to the power control element 145 via connection 138. The AM signal supplied by the modulator via connection 138 is first supplied to a reference variable gain element associated with the RF subsystem 130. The AM signal supplied by the modulator 146 is an intermediate frequency (IF) AM signal with a constant (average) power level that is supplied as a reference signal to the reference variable gain element to be described below.

The synthesizer 300, which will be described below, determines the appropriate frequency to which the upconverter 154 will translate the modulated signal. In this embodiment, the synthesizer uses a single voltage controlled oscillator (VCO), operating at a center frequency of approximately 2.5 to 3.0 gigahertz (GHz) in this example, and only frequency dividers to provide the desired LO signals to the transmitter 400 and to the receiver 200.

The upconverter 154 supplies a phase modulated signal at the appropriate transmit frequency via connection 158 to the power amplifier 160. The power amplifier 160 amplifies the phase modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

In one embodiment, a portion of the amplified transmit signal power on connection 162 can be supplied via connection 170 to power control element 145. In this embodiment, the power control element 145 forms a continuous closed power control feedback loop and supplies an information signal on connection 172 instructing the power amplifier 160 as to the power to which the signal on connection 158 should be amplified. The power control element 145 also receives an LO signal from the synthesizer 300 via connection 198. In this embodiment, a synthesizer 300 having a single VCO supplies all of the required LO signals to the receiver 200 and the transmitter 400.

A signal received by antenna 164 may, at the appropriate time determined by baseband subsystem 110, be directed via switch 166 to a receive filter 168. The receive filter 168 filters the received signal and supplies the filtered signal on connection 174 to a low noise amplifier (LNA) 176. Although a single LNA 176 is shown in FIG. 1, it is understood that a plurality of LNAs are typically used, depending on the frequency or frequencies on which the portable transceiver 100 operates. The receive filter 168 may be a bandpass filter that passes all channels of the particular cellular system where the portable transceiver 100 is operating. As an example, for a 900 MHz GSM system, receive filter 168 would pass all frequencies from 925.1 MHz to 959.9 MHz, covering all 175 contiguous channels of 200 kHz each. The purpose of the receive filter 168 is to reject all frequencies outside the desired region. The LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB). In this example, the receiver 200 operates as a direct conversion receiver (DCR) in which the received RF signal is downconverted directly to a baseband signal. In one embodiment, the LNA 176 is fully differential and operates without inductances and baluns and using no voltage gain such that large electric fields are eliminated at the input to the LNA 176.

The downconverter 178 receives one or more LO signals from synthesizer 300 via connection 180. In this embodiment, the LO signals are shifted in phase by approximately 45 degrees to provide frequency translation of the in-phase and the quadrature-phase received signals without the use of polyphase filters or large inductances in the receive signal path. The synthesizer 300 determines the frequency to which to downconvert the signal received from the LNA 176 via connection 182. In the case of a DCR, the received signal is converted directly to baseband (DC), or near-baseband. The downconverter 178 sends the downconverted signal via connection 184 to a channel filter 186, also called the "IF filter." The channel filter 186 selects the one desired channel and rejects all others. Using the GSM system as an example, only one of the 175 contiguous channels is actually to be received. After all channels are passed by the receive filter 168 and downconverted in frequency by the downconverter 178, only the one desired channel will appear precisely at the center frequency of channel filter 186. The synthesizer 300, by controlling the local oscillator frequency supplied on connection 180 to downconverter 178, determines the selected channel. The demodulator 194 recovers the transmitted analog information and supplies a signal representing this information via connection 196 to the ADC 134. The ADC 134 converts these analog signals to a digital signal at baseband frequency and transfers it via bus 128 to DSP 126 for further processing.

Figure 2:
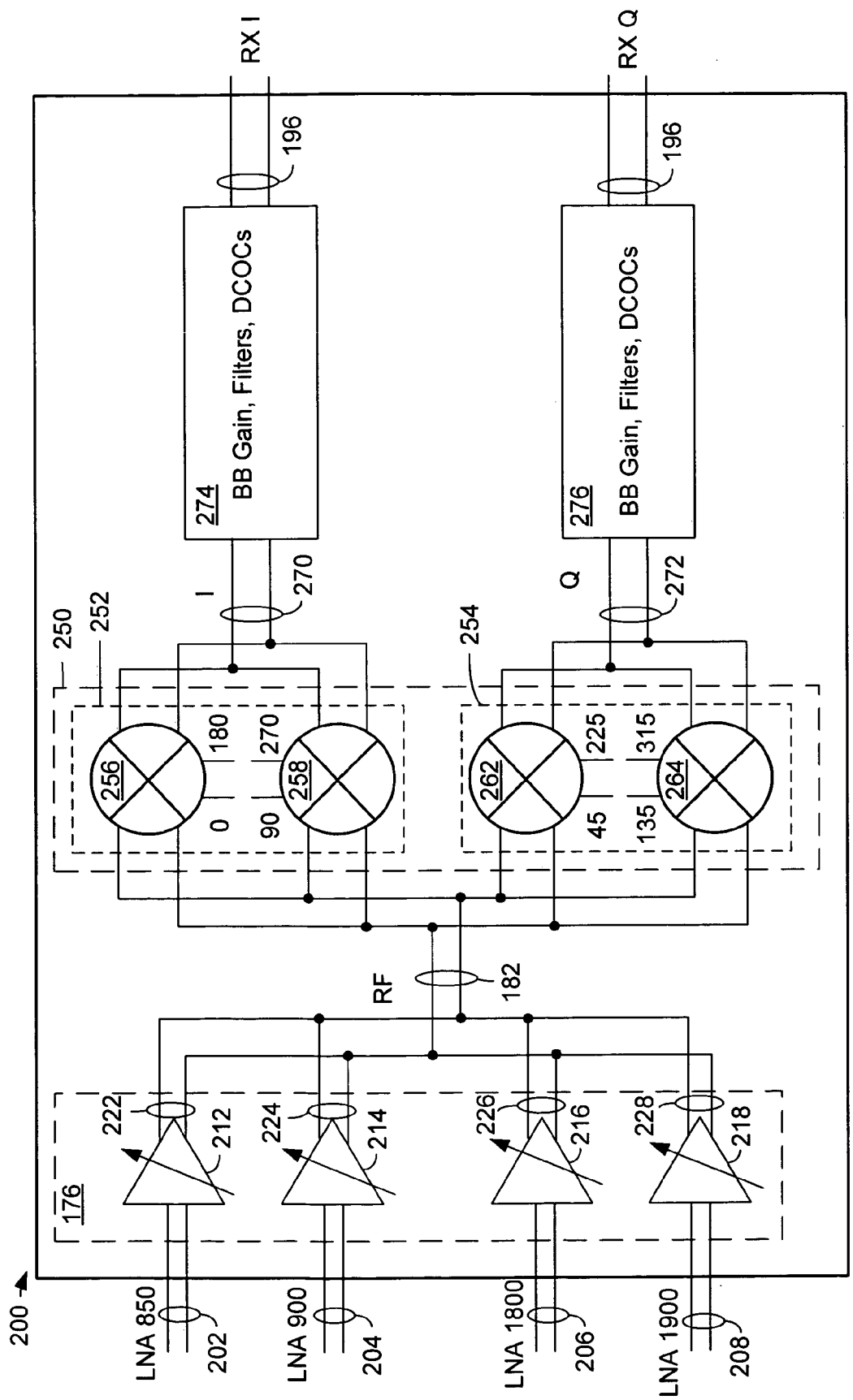
FIG. 2 is a schematic diagram illustrating the receiver of FIG. 1.

FIG. 2 is a schematic diagram illustrating the receiver 200 of FIG. 1. The depiction of the receiver 200 in FIG. 2 is simplified to illustrate primarily the concepts of the GSM/EDGE transceiver architecture that pertain to the receiver 200. The receiver 200 includes an LNA section 176, a downconverter section illustrating using mixer 250 and both inphase and quadrature-phase gain and filter elements 274 and 276. In this embodiment, the LNA section 176 comprises LNAs 212, 214, 216 and 218, each designed to receive a signal in a particular transmission frequency band. The LNAs 212, 214, 216 and 218, and all the elements in the receiver to be described below, are fully differential, thereby eliminating the need for single ended to differential conversion circuitry. In this example, the LNAs 212 and 214 operate in the GSM (850 MHz)/EGSM (900 MHz) communication bands and the LNAs 216 and 218 operate in the PCS (1900 MHz)/DCS (1800 MHz) communication bands. The LNA 212 is designed to receive a differential 850 MHz receive signal via connection 202 and the LNA 214 is designed to receive a differential 900 MHz receive signal via connection 204. The LNA 216 is designed to receive a differential 1800 MHz receive signal via connection 206 and the LNA 218 is designed to receive a differential 1900 MHz receive signal via connection 208. The outputs of the LNAs 212, 214, 216, and 218 are supplied via connection 182 directly to the mixer 250.

A subharmonic mixer 250 is used to down convert the RF signal directly to baseband. A subharmonic mixer reduces DC offset created by LO self-mixing. The in-phase and quadrature-phase signals are created by providing phase-shifted LO signals that are at a nominal 45 degrees phase shift from each other. This approach avoids the use of "poly-phase filters" in the RF path, therefore, avoiding the loss caused by poly-phase filters in the RF path. Using phase shifted LO signals, the generation of which will be described below, allows the receiver 200 to be free of the lossy "poly-phase" filter in the RF path. In the past, the phase of the received RF signal was phase shifted by one or more poly-phase filter networks to achieve the in-phase and quadrature-phase downconversion. To compensate for the loss in the poly-phase signal, the RF signal had to be amplified prior to being applied to a subharmonic mixer (requiring extra current and degrading the IP2 second order intercept point). In the GSM/EDGE transceiver architecture described herein, the mixer 250 employs phase-shifted LO signals to perform the downconversion, thereby eliminating the need for the poly-phase filters. The use of the phase-shifted LO signals allows the output of the LNAs 212, 214, 216 and 216 to be combined and supplied to a single mixer 250. This leads to a reduction in die size and a simplified receiver design. In this embodiment, the signal path from the input of the LNA section 176 to the output of the mixer 250 is fully differential, thus reducing DC offset, receiver self-mixing, frequency variations between the in-phase and quadrature-phase channels, and minimizing degradation of the signal-to-noise ratio (s/n) and leakage of the transmit signal through the receive path.

Further, because there is no loss attributable to poly-phase filters in the RF path, there is no additional amplification used in the receiver 200, thereby minimizing power consumption of the receiver 200.

The mixer 250 comprises in-phase mixer element 252 and quadrature-phase mixer element 254. The in-phase mixer element 252 includes mixer cores 256 and 258. The quadrature-phase mixer element 254 comprises mixer cores 262 and 264. The received RF signal is coupled via connection 182 to the mixer cores 256, 258, 262 and 264. The mixer cores 256, 258, 262 and 264 receive phase-shifted LO signals from the synthesizer 300, which will be described in detail below. By employing phase-shifted LO signals, the RF input signal supplied to the mixer stays intact, thus eliminating the need for a phase shifting network (such as one or more poly-phase filters) in the RF path. Further, the use of fully differential LNA section 176 and the single mixer 250 substantially improve the second intercept point (IP2) performance of the receiver 200 to the point where IP2 calibration is not necessary.

The ability to use a single mixer 250 for both high bands (1800 MHz/1900 MHz) and low bands (850 MHz/900 MHZ) allows the die area consumed by the receiver 200 to be minimized and simplifies the layout of the integrated circuit on which the receiver 200 is formed. Further, simplifying the layout of the integrated circuit minimizes parasitic capacitances, makes the receiver design more symmetrical than if two or more mixers were used, and simplifies and minimizes gain receive calibration for different receive bands. Further, minimizing the voltage of the RF signal prior to the mixer 250 helps minimize RF self-mixing, which can occur if large RF voltage couples or radiates onto the LO ports of the mixer 250. Further, a fully differential path from the input of the down-converter to its output (i.e., from the input to the LNA section 176 to the output of the in-phase and quadrature-phase gain and filter elements 274 and 276) allows the minimization of another IP2 mechanism, which is related to asymmetric analog processing of the positive and negative half-waveform of the input signal.

In this embodiment, 0 degree and 180 degree LO signals are supplied to the mixer core 256, 90 degree and 270 degree LO signals are supplied to the mixer core 258, 45 degree and 225 degree LO signals are supplied to the mixer core 262, and 135 degree and 315 degree LO signals are supplied to the mixer core 264. The differential output of the in-phase mixer element 252 is supplied via connection 270 to the in-phase gain and filter element 274, and the differential output of the quadrature-phase mixer element 254 is supplied via connection 272 to the quadrature-phase gain and filter element 276. The baseband section of the receiver 200, illustrated as the baseband gain and filtering elements 274 and 276 provide gain, channel select filtering that enables the receiver 200 to meet the GSM standard, and DC offset compensation (DCOC). Various stages of filtering, followed by gain are employed, as known in the art.

The differential output of the in-phase gain and filter element 274 and the differential output of the quadrature-phase gain and filter element 276 is supplied via connection 196 to the ADC 134 (FIG. 1) for conversion to the digital domain and further processing the baseband subsystem 110.

Figure 3:
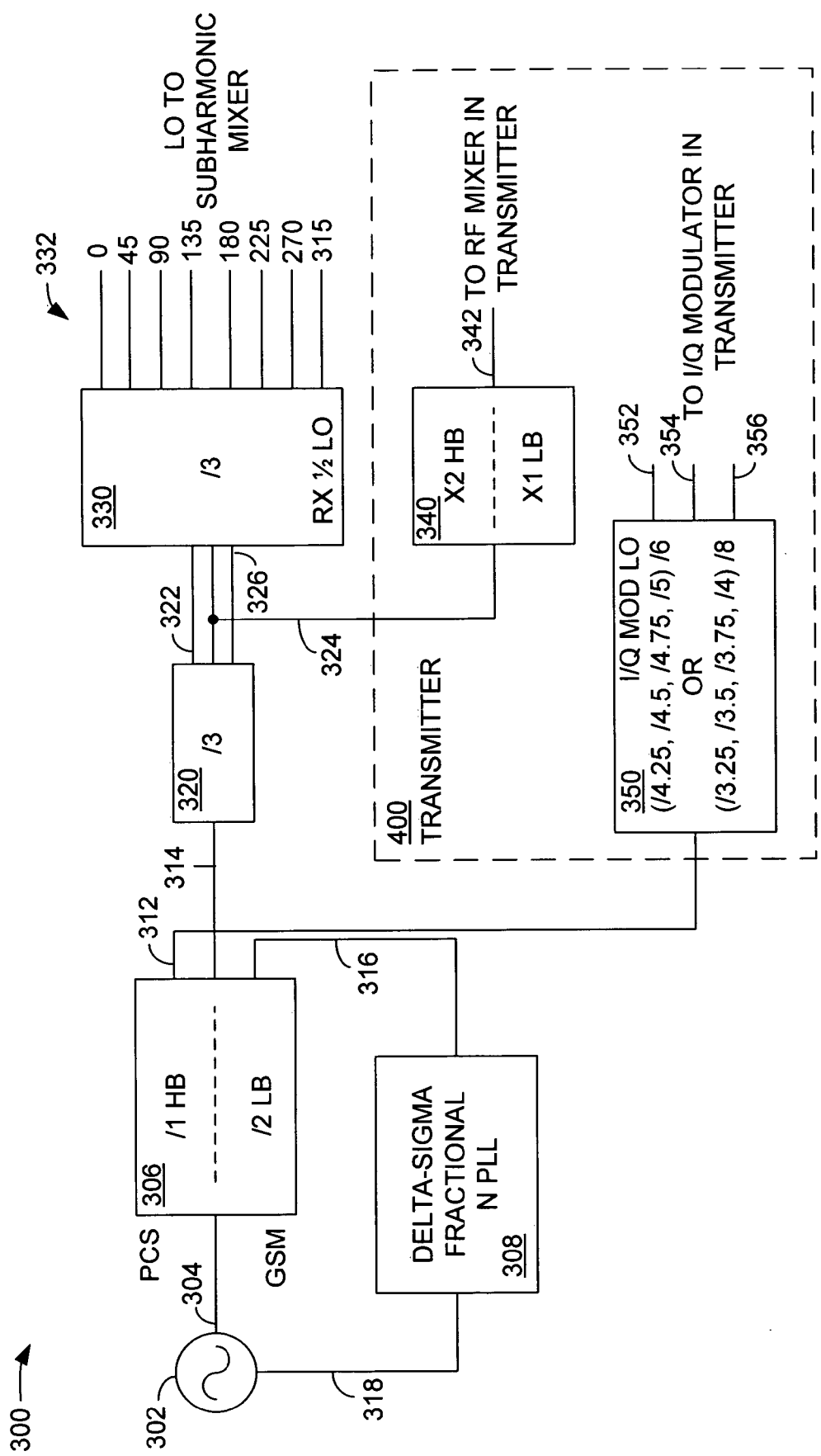
FIG. 3 is a schematic diagram of the synthesizer of FIG. 1.

FIG. 3 is a schematic diagram of the synthesizer 300 of FIG. 1. The synthesizer 300 includes a voltage controlled oscillator 302 (VCO) designed to operate approximately in the 2.5-3.0 gigahertz (GHz) frequency range, and in one embodiment, has a center frequency of approximately 2.8 GHz and a tuning range of approximately ±250 megahertz (MHz). The output of the VCO 302 is supplied via connection 304 to a frequency divider 306. In this embodiment, when used for high band operation in the high (1800/1900) frequency bands, the frequency divider 306 divides the input frequency on connection 304 by one (1). When used for low band operation in the low (850/900) frequency bands the frequency divider 306 divides the input frequency on connection 304 by two (2).

When used to supply signals to the receiver 200, the output of the frequency divider 306 is sent via connection 314 to another frequency divider 320. The frequency divider 320 divides the frequency of the signal on connection 314 by three (3) and supplies outputs on connections 322, 324 and 326 to a phase combiner 330.

The use of a VCO 302 operating at approximately 2.8 GHz, and the frequency dividers 306 and 320 eliminate the need for frequency multipliers in the synthesizer 300. As compared to frequency multipliers, frequency dividers require less die area on the integrated circuit chip, generate less noise and consume less power. The dividers 306 and 320 generally provide a wide range of operation while maintaining the phase accuracy of the input signals and provide a consistent harmonic content.

The /2 low band output of the frequency divider 306 is supplied via connection 316 to the phase locked loop (PLL) 308. In this embodiment, the phase locked loop 308 is a delta-sigma fractional N phase locked loop. The output of the phase locked loop 308 is supplied via connection 318 as feedback to the VCO 302.

In the receive mode, the phase combiner 330 generates the ½ LO phase-shifted LO signals that are supplied to the sub-harmonic mixer 250 (FIG. 2). The phase combiner 330 occupies significantly less area on the die and consumes less power when compared to a poly-phase filter network, and supplies accurate 45 degree phase-shifted signals on connections 332. In this embodiment, the phase combiner supplies 0, 45, 90, 135, 180, 225, 270 and 315 degree LO signals for downconverting the RF signal in the sub-harmonic mixer 250 (FIG. 2). The phase combiner 330 receives an IF signal on connections 322, 324 and 326. The phase of the signal on connection 322 is 0 degrees, the phase of the signal on connection 324 is 60 degrees and the phase of the signal on connection 326 is 120 degrees. The phase combiner 330 receives 3 phases, 0, 60 and 120 degrees, of the divide by three output of the divider 320. From these 0, 60 and 120 degree phases, 0 and 90 degree (relative to each other) signals are generated. From the 0 and 90 degree signals, the 0, 45, 90, 135, 180, 225, 270 and 315 degree signals are generated. This signal generation occurs in the phase combiner 330.

The output of the divider 320 on connection 324 is also supplied to components in the transmitter 400, but which are illustrated in FIG. 3 for ease of description of the synthesizer 300. Portions of the transmitter 400 are shown for reference. As it pertains to the synthesizer 300, the transmitter 400 comprises an I/Q modulator divider 350 and an LO multiplier element 340. The LO multiplier element 340 provides the frequency reference LO signal to a mixer located in the transmitter 400, and which will be described below. In high band operation, the LO multiplier element 340 multiplies the signal on connection 324 by a factor of two (2) and supplies the multiplied signal via connection 342 (connection 198 in FIG. 1) to the transmitter 400. In low band operation, the LO multiplier element 340 multiplies the signal on connection 324 by a factor of one (1) and supplies the signal via connection 342 (connection 198 in FIG. 1) to the transmitter 400.

The I/Q modulator divider 350 receives the output of the frequency divider 306 on connection 312 and operates on it to provide the proper LO signal to the modulator 146 (FIG. 1) via connections 352, 354 and 356. The I/Q modulator divider 350 can be implemented using a number of different divide factors, depending on the implementation of the modulator. In one embodiment, the I/Q modulator divider 350 is implemented to have a first stage programmable to divide by 4.25, 4.5, 4.75, or 5, and a second stage to divide by 6. In another embodiment, the I/Q modulator divider 350 is implemented to have a first stage programmable to divide by 3.25, 3.5, 3.75, or 4, and a second stage to divide by 8. Having at least two divide options maximizes flexibility in the transmit frequency plan. In this manner, the same RF transmit frequency can be generated from the different combination of the UHF LO frequency and interim intermediate frequency. Such flexibility is desirable because in many cases some M×N products of different frequencies coexist in the chip and would generate unwanted spurious tone or tones. The unwanted spurious tones could cause the transceiver to fail either far-off or close-in spectrum/spurious emission requirements. In this embodiment, the last frequency divider for IF generation for the I/Q modulator is a multiple of either 3 or 4 due to the particular architectures of the harmonic reject I/Q modulators that will likely be implemented as the modulator 146 (FIG. 1). In one embodiment, the modulator 146 can be implemented with an additional ±30 degree phase shifted LO in addition to the normal 90 degrees. In another embodiment the I/Q modulator 146 can be implemented with three (3) differential 45 degree phase-shifted LO signals.

Figure 4:
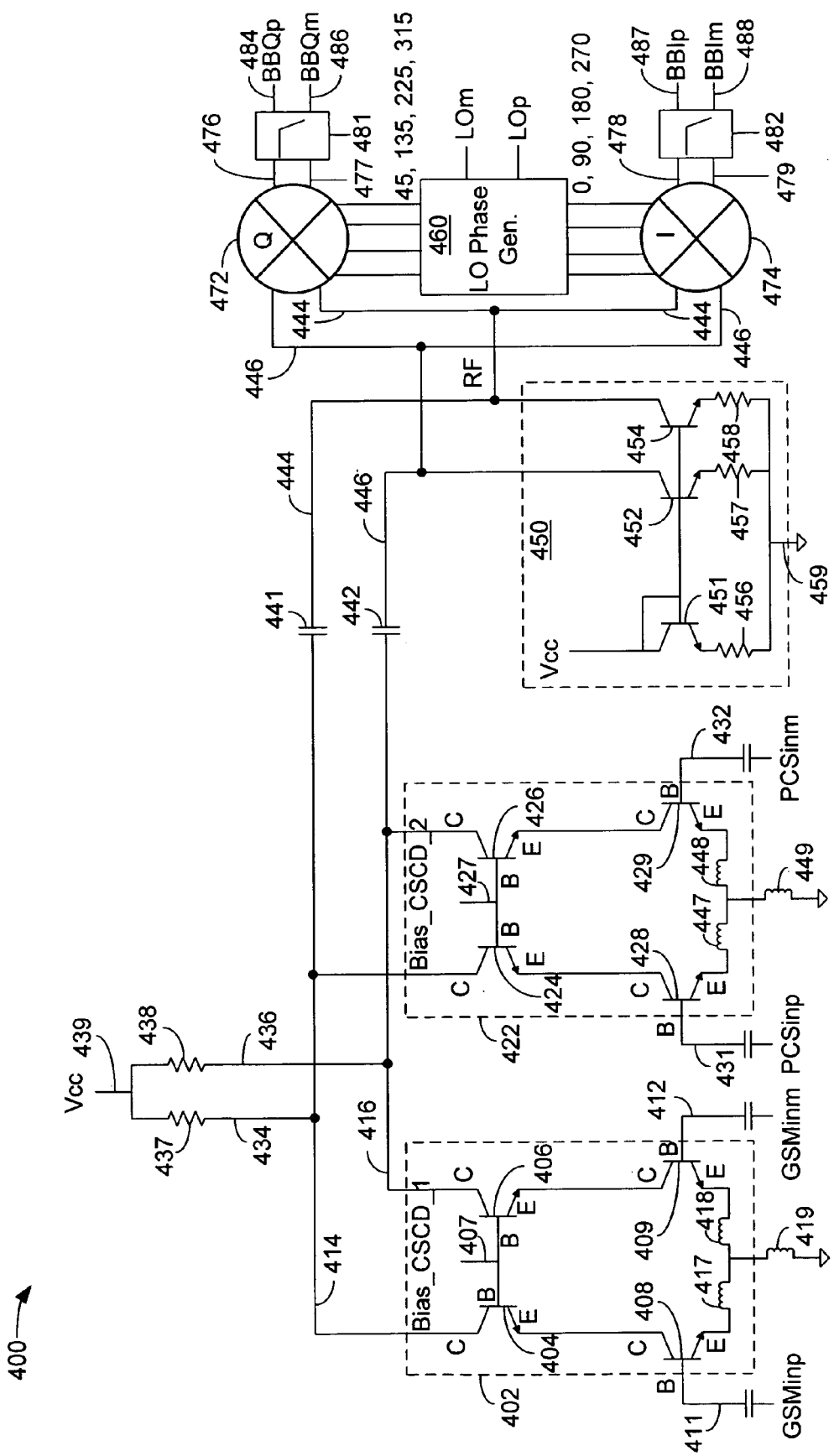
FIG. 4 is a block diagram illustrating the receiver of FIG. 1 in greater detail.

FIG. 4 is a block diagram illustrating the receiver 200 of FIG. 1 in greater detail. In FIG. 4, the receiver is generally referred to using reference numeral 400. In this embodiment, the receiver 400 includes a GSM LNA 402 and a PCS LNA 422. The GSM LNA 402 and the GSM LNA 422 are illustrated in FIG. 4 as implemented using bipolar junction transistor technology. However, the GSM LNA 402 and the GSM LNA 422 can be implemented using other technology, such as for example, field effect transistor (FET) technology, or other technologies. In this embodiment, the GSM LNA 402 comprises transistors 404, 406, 408 and 409. The base terminals of the transistors 408 and 409 are coupled to the GSM band radio frequency input signals GSMinp and GSMinm on connections 411 and 412, respectively. The designations "p" (plus) and "m" (minus) are arbitrary and denote differential signals. The GSMinp and GSMinm input signals are differential signals. The emitter terminals of the transistors 408 and 409 are arranged in a two inductor (inductors 417 and 418) degeneration arrangement for the differential signal and have a common inductor 419 coupled to ground.

The base terminals of the transistors 404 and 406 are coupled to a bias signal (Bias_CSCD1), which in this embodiment is a cascode bias signal. The collector terminal of the transistor 404 provides an output on connection 414 and the collector terminal of the transistor 406 provides an output on connection 416.

In this embodiment, the GSM LNA 422 comprises transistors 424, 426, 428 and 429. The base terminals of the transistors 428 and 429 are coupled to the PCS band radio frequency input signals PCSinp and PCSinm on connections 431 and 432, respectively. The PCSinp and PCSinm input signals are differential signals. The emitter terminals of the transistors 428 and 429 are arranged in a two inductor (inductors 447 and 448) degeneration arrangement for the differential signal and have a common inductor 449 coupled to a ground.

The base terminals of the transistors 424 and 426 are coupled to a bias signal (Bias_CSCD2), which in this embodiment is a cascode bias signal. The collector terminal of the transistor 424 provides an output on connection 414 and the collector terminal of the transistor 426 provides an output on connection 416.

The connections 414 and 416 are coupled to a supply voltage source, Vcc, via connections 434 and 436, respectively. The connection 434 is coupled to a resistor 437 and the connection 436 is coupled to a resistor 438. The resistors 437 and 438 provide a resistive load that is shared among the transistors in the GSM LNA 402 and the PCS LNA 422. The resistive load provided by the resistors 437 and 438 appears as a high impedance to the differential LNAs 402 and 422.

Capacitors 441 and 442 are coupled to the connections 414 and 416, respectively. The capacitors 441 and 442 block direct current (DC) signals from entering the subharmonic mixers 472 and 474. The capacitors 441 and 442 fold the RF current from the GSM LNA 402 and the PCS LNA 422 to the subharmonic mixers 472 and 474, and provide a low impedance to the subharmonic mixers 472 and 474. Further, after the conversion of the RF signal to a current by the LNAs, the capacitors 441 and 442 remove any second order nonlinearities created in the LNAs, thus improving IP2 performance by minimizing second order intermodulation (IM2). The IM2 gives rise to the second order intercept point (IP2).

The input impedance provided to the subharmonic mixer by the capacitors 441 and 442 that are located in series with the subharmonic mixer is lower than the impedance provided to the subharmonic mixer by the resistors 437 and 438. Therefore, the majority of the current will flow through the capacitors 441 and 442 to the mixer input rather than flowing into the resistors 437 or 438. In this manner, the capacitors 441 and 442 provide a lower impedance path for the RF input signal and therefore, the RF input signal, which is in current mode, will go through the subharmonic mixers 472 and 474.

The receiver 400 also includes a current source 450. The current source 450 provides current for the subharmonic mixers 472 and 474. While the current source 450 is illustrated as being implemented using bipolar junction transistor technology, the current source 450 can be implemented using other technologies, such as for example, FET technology. The current source 450 includes transistors 451, 452 and 454 having emitter terminals that are coupled to a common reference through resistors 456, 457 and 458, respectively. The collector terminal of the transistor 451 is coupled to a supply voltage, Vcc. The collector terminal of the transistor 452 is coupled to connection 446 and the collector terminal of the transistor 454 is coupled to the connection 444. The RF current signals from the LNAs 402 and 422 are supplied on connections 444 and 446. In this example, one of the differential signals is supplied on connection 444 and the other differential signal is supplied on connection 446; however, this designation is arbitrary.

Both differential signals supplied by the LNAs 402 and 422 on connections 444 and 446 are supplied to each of the subharmonic mixers 472 and 474. In this embodiment, the subharmonic mixer 472 is referred to as the quadrature-phase (Q) subharmonic mixer and the subharmonic mixer 474 is referred to as the in-phase (I) subharmonic mixer; however, this designation is arbitrary.

The LO phase generator 330 (described above) supplies offset phase LO signals to the subharmonic mixers 472 and 474. In this example, the LO phase generator supplies 0, 90, 180 and 270 degree offset LO signals to the subharmonic mixer 474 and supplies 45, 135, 225 and 315 degree offset LO signals to the subharmonic mixer 472. By supplying the offset phase LO signals in the LO path, polyphase filters are eliminated from the RF path. Eliminating polyphase filters from the RF path removes the associated loss from the RF path that would degrade the noise performance of the receiver and minimizes the amount of die area used by the RF components. In addition, placing the mixer phase shift in the LO path instead of the RF path minimizes the RF voltage amplitude, which further improves the IP2 performance of the receiver.

The output of the subharmonic mixer 472 is supplied as differential signals on connections 476 and 477 to a low pass filter 481. The output of the low pass filter 481 on connection 484 is one of the differential baseband quadrature-phase signals (BBQp) and the output of the low pass filter 481 on connection 486 is the other differential baseband quadrature-phase signal (BBQm).

The output of the subharmonic mixer 474 is supplied as differential signals on connections 478 and 479 to a low pass filter 482. The output of the low pass filter 482 on connection 487 is one of the differential baseband in-phase signals (BBIp) and the output of the low pass filter 482 on connection 488 is the other differential baseband in-phase signal (BBIm).

Figure 5:
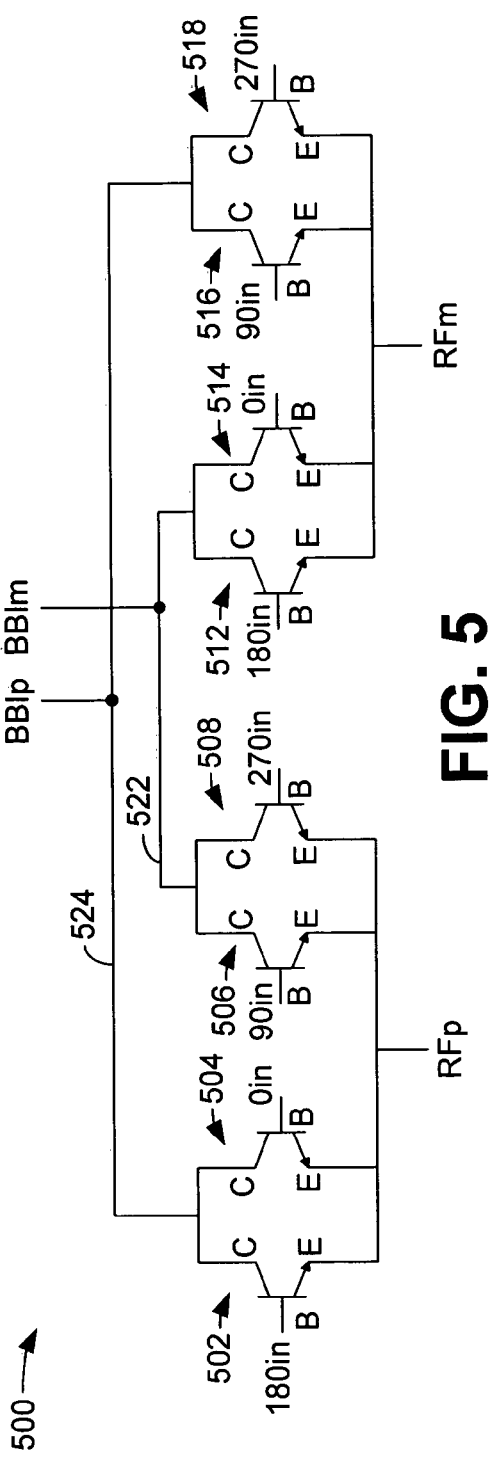
FIG. 5 is a schematic diagram illustrating an embodiment of the subharmonic mixer of FIG. 4.

FIG. 5 is a schematic diagram illustrating an embodiment 500 of the subharmonic mixer of FIG. 4. Although illustrated as being implemented using bipolar junction transistor technology, the subharmonic mixer 500 can be implemented using other technologies, such as for example, FET technology. Further, the subharmonic mixer 500 as illustrated is configured to operate on the in-phase differential signals. The subharmonic mixer 500 includes transistors 502, 504, 506, 508, 512, 514, 516 and 518 connected in a common-emitter configuration. The base terminals of the transistors 504 and 514 are configured to receive a 0 degree LO signal and the base terminals of the transistors 506 and 516 are configured to receive a 90 degree LO signal. The base terminals of the transistors 502 and 512 are configured to receive a 180 degree LO signal and the base terminals of the transistors 508 and 518 are configured to receive a 270 degree LO signal. The emitter terminals of the transistors 502, 504, 506 and 508 are coupled to one of the differential RF inputs (RFp) and the emitter terminals of the transistors 512, 514, 516 and 588 are coupled to the other differential RF input (RFm). One of the differential baseband in-phase output (BBIp) is provided from the collector terminals of the transistors 502, 504, 516 and 518 via connection 524, and the other differential baseband in-phase output (BBIm) is provided from the collector terminals of the transistors 506, 508, 512 and 514 via connection 522.

Figure 6:
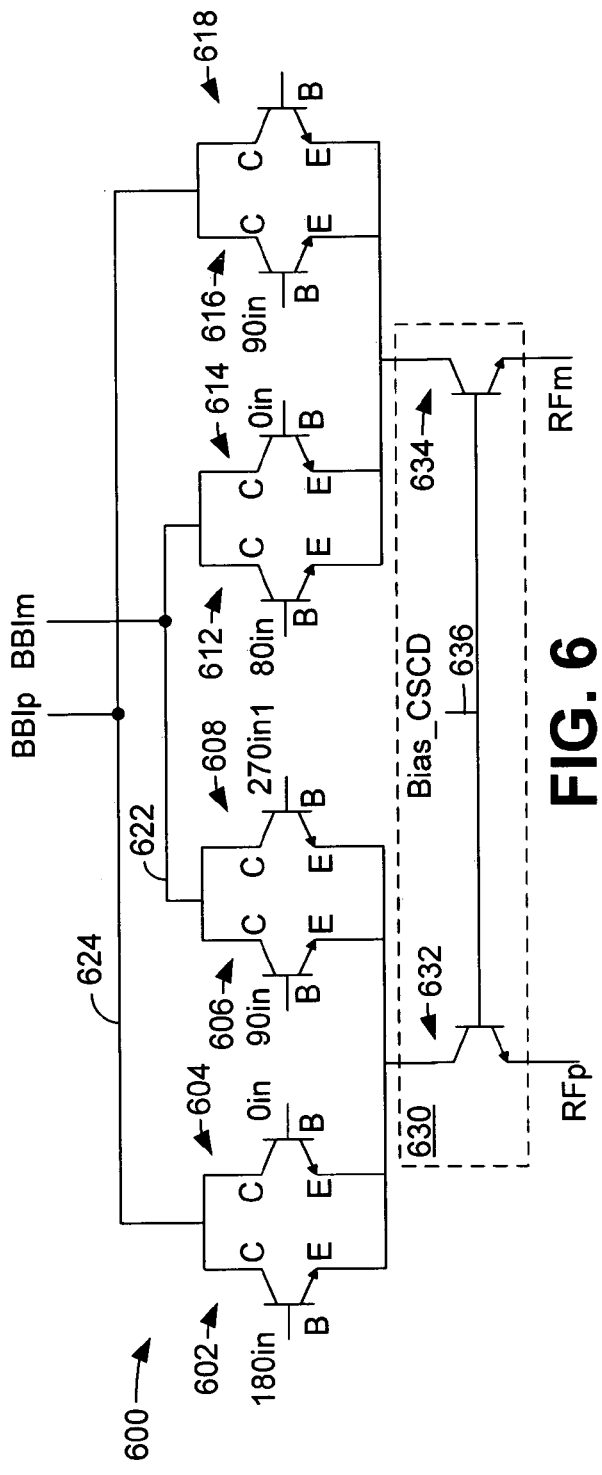
FIG. 6 is a schematic diagram illustrating an alternative embodiment of the subharmonic mixer of FIG. 4.

FIG. 6 is a schematic diagram illustrating an alternative embodiment 600 of the subharmonic mixer of FIG. 4. Although illustrated as being implemented using bipolar junction transistor technology, the subharmonic mixer 600 can be implemented using other technologies, such as for example, FET technology. The subharmonic mixer 600 is similar to the subharmonic mixer 500 of FIG. 5; however, the subharmonic mixer 600 includes a cascode circuit to further isolate the RF input signal from the switching core of the subharmonic mixer 600. The devices in the cascode circuit also provide a low input impedance at their emitters (i.e. the output of the LNAs experience a low impedance node).

The subharmonic mixer 600 as illustrated is configured to operate on the in-phase differential signals. The subharmonic mixer 600 includes transistors 602, 604, 606, 608, 612, 614, 616 and 618 connected in a common-emitter configuration. The base terminals of the transistors 604 and 614 are configured to receive a 0 degree LO signal and the base terminals of the transistors 606 and 616 are configured to receive a 90 degree LO signal. The base terminals of the transistors 602 and 612 are configured to receive a 180 degree LO signal and the base terminals of the transistors 608 and 618 are configured to receive a 270 degree LO signal. The emitter terminals of the transistors 602, 604, 606 and 608 are coupled to the collector of cascode transistor 632. The emitter terminal of the cascode transistor 632 is coupled to one of the differential RF inputs (RFp). The emitter terminals of the transistors 612, 614, 616 and 688 are coupled to the collector terminal of the cascode transistor 634. The emitter terminal of the cascode transistor 634 is coupled to the other differential RF input (RFm).

One of the differential baseband in-phase output (BBIp) is provided from the collector terminals of the transistors 602, 604, 616 and 618 via connection 624, and the other differential baseband in-phase output (BBIm) is provided from the collector terminals of the transistors 606, 608, 612 and 614 via connection 622. A cascode bias signal (Bias_CSCD) is supplied via connection 636 to the base terminals of the cascode transistors 632 and 634.

Figure 7:
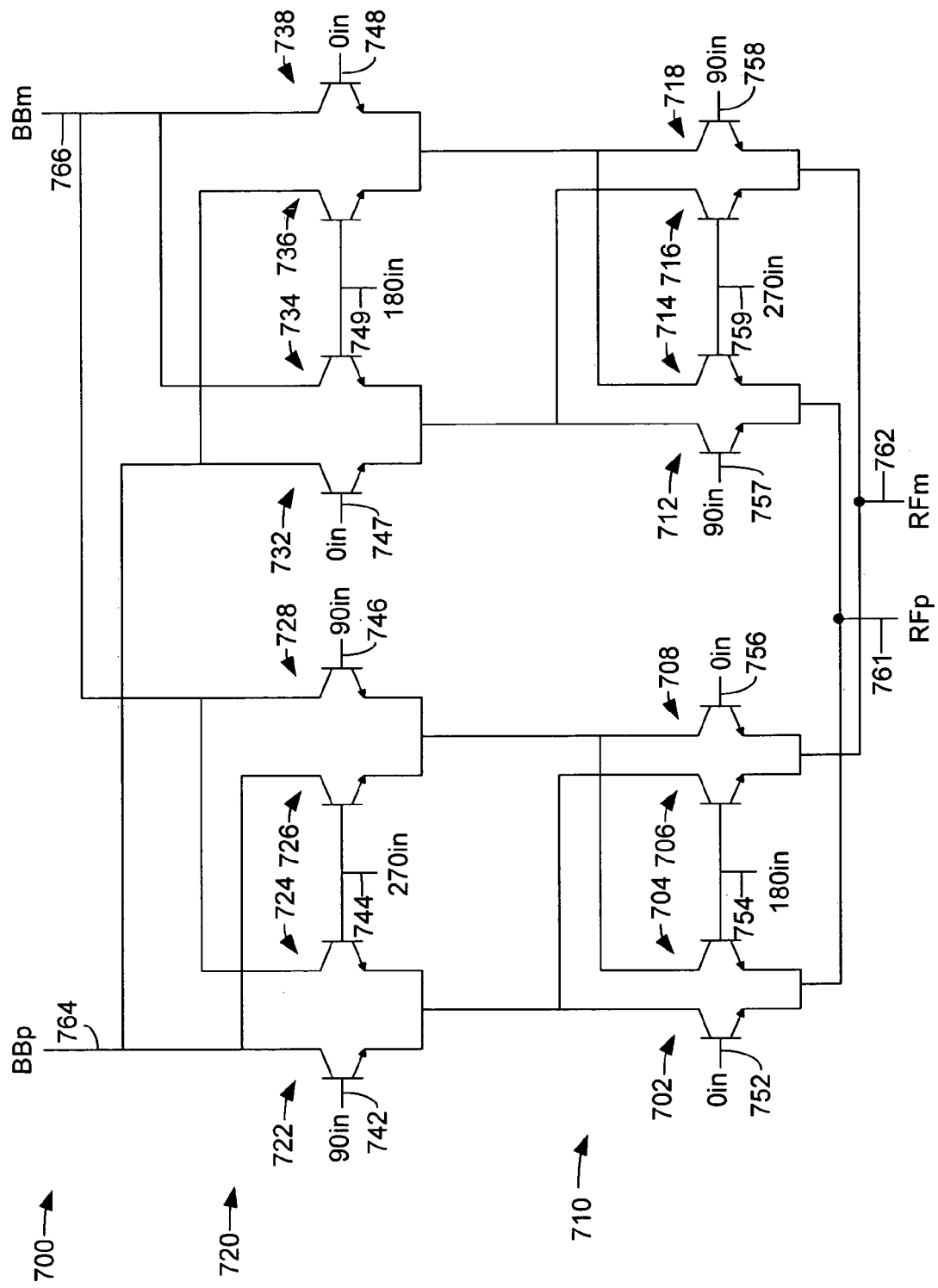
FIG. 7 is a schematic diagram illustrating an alternative embodiment of the subharmonic mixer of FIG. 4.

FIG. 7 is a schematic diagram illustrating an alternative embodiment 700 of the subharmonic mixer of FIG. 4. The subharmonic mixer 700 is referred to as a stacked-parallel topology. The subharmonic mixer 700 as illustrated is configured to operate on the in-phase differential signals. A complete subharmonic mixer would include additional circuitry to operate on the quadrature-phase signals and would have LO inputs shifted by 45 degrees. The subharmonic mixer 700 includes a first portion 710 and a second portion 720. The first subharmonic mixer portion 710 includes transistors 702, 704, 706, 708, 712, 714, 716 and 718. The emitter terminals of the transistors 702, 704, 712 and 714 are configured to receive one of the differential RF inputs (RFp). The emitter terminals of the transistors 706, 708, 716 and 718 are configured to receive the other differential RF input (RFm).

The second portion 720 includes transistors 722, 724, 726, 728, 732, 734, 736 and 738. The emitter terminals of the transistors 722 and 724 are coupled to the collector terminals of the transistors 702 and 706. The emitter terminals of the transistors 726 and 728 are coupled to the collector terminals of the transistors 704 and 708. The emitter terminals of the transistors 732 and 734 are coupled to the collector terminals of the transistors 712 and 716. The emitter terminals of the transistors 736 and 738 are coupled to the collector terminals of the transistors 714 and 718. One of the baseband differential output signals (BBp) is taken from the collector terminals of the transistors 722 and 732. The other baseband differential output signal (BBm) is taken from the collector terminals of the transistors 728 and 738.

The architecture of the subharmonic mixer 700 provides improved IP2 performance, minimizes noise and is highly immune to base-emitter voltage mismatch, parasitic capacitive loading of the common emitter switching core, and current mismatch.

Figure 8:
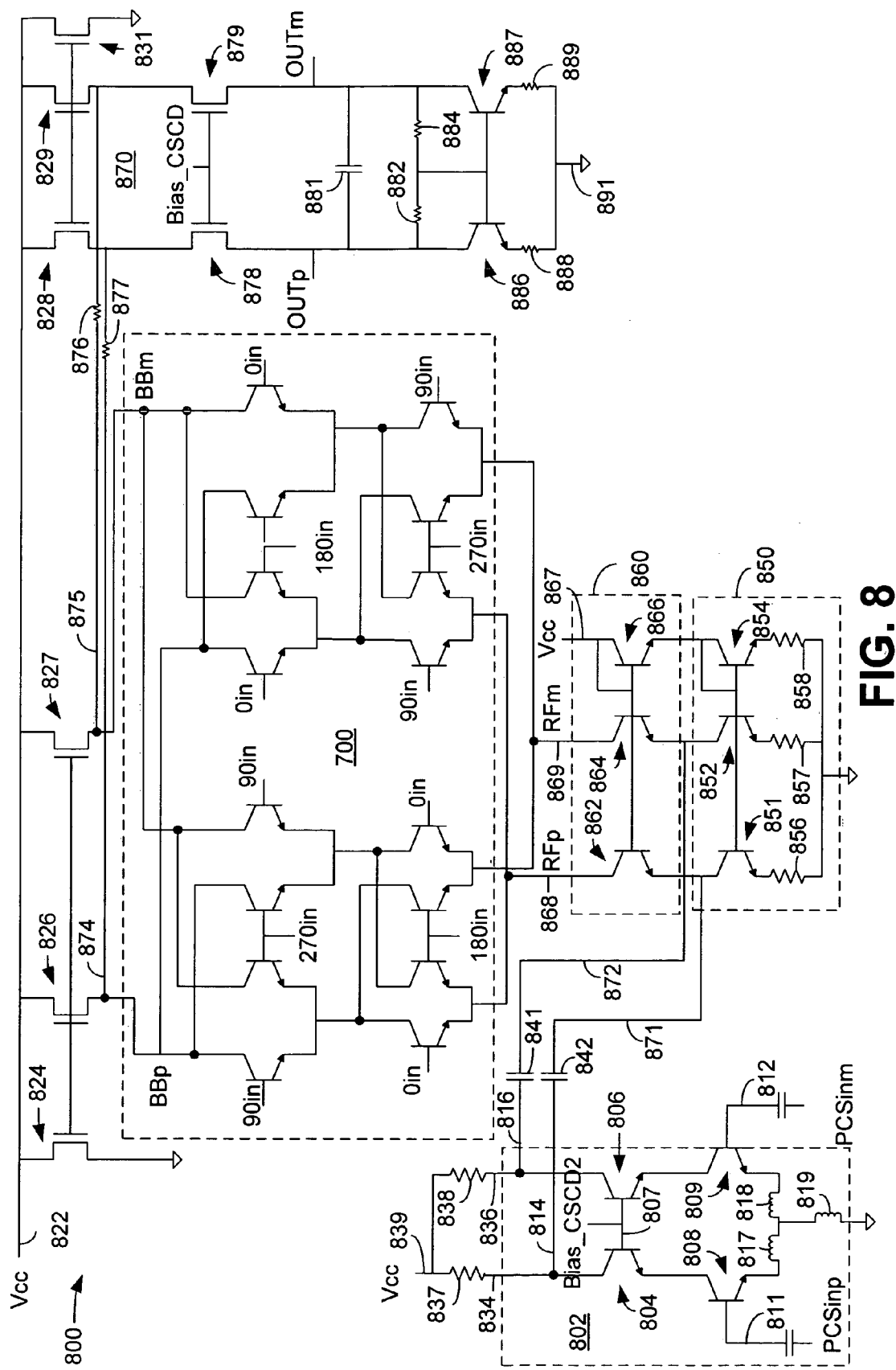
FIG. 8 is a schematic diagram illustrating a receiver having a simplified LNA and mixer circuit for one LNA and for processing the in-phase (I) signal component.

FIG. 8 is a schematic diagram illustrating a receiver having a simplified LNA and mixer circuit for one LNA and for processing the in-phase (I) signal component. The receiver 800 comprises a PCS LNA 802 that is illustrated as being operable on the PCS signal band. However, the LNA could be operative on other receive bands. The PCS LNA 802 is illustrated in FIG. 8 as implemented using bipolar junction transistor technology. However, the PCS LNA 802 can be implemented using other technology, such as for example, field effect transistor (FET) technology, or other technologies. In this embodiment, the PCS LNA 802 comprises transistors 804, 806, 808 and 809. The base terminals of the transistors 808 and 809 are coupled to the PCS band radio frequency input signals PCSinp and PCSinm on connections 811 and 812, respectively. The PCSinp and PCSinm input signals are differential signals. The emitter terminals of the transistors 808 and 809 are arranged in a two inductor (inductors 817 and 818) degeneration arrangement for the differential signal and have a common inductor 819 coupled to ground.

The base terminals of the transistors 804 and 806 are coupled to a bias signal (Bias_CSCD2). The collector terminal of the transistor 804 provides an output on connection 814 and the collector terminal of the transistor 806 provides an output on connection 816.

The connections 814 and 816 are coupled to a supply voltage source, Vcc, via connections 834 and 836, respectively. The connection 834 is coupled to a resistor 837 and the connection 836 is coupled to a resistor 838. The resistors 837 and 838 provide a resistive load that is shared among the transistors in the PCS LNA 802. The resistive load provided by the resistors 837 and 838 appears as a high impedance to the differential LNA 802.

Capacitors 841 and 842 are coupled to the connections 816 and 814, respectively. The capacitors 841 and 842 block direct current (DC) signals from entering the subharmonic mixer 700. The capacitors 441 and 442 fold the RF current from the PCS LNA 802 to the subharmonic mixer 700 a current source 850 and a cascode transistor circuit 860, and provide a low impedance to the subharmonic mixer 700. Further, after the conversion of the RF signal to a current by the LNA 802, the capacitors 441 and 442 remove any second order nonlinearities created in the LNA 802, thus improving IP2 performance.

The receiver 800 also includes a current source 850. The current source 850 provides current for the subharmonic mixer 700. While the current source 850 is illustrated as being implemented using bipolar junction transistor technology, the current source 850 can be implemented using other technologies, such as for example, FET technology. The current source 850 includes transistors 851, 852 and 854 having emitter terminals that are coupled to a common reference through resistors 856, 857 and 858, respectively.

The current source 850 is connected to a cascode transistor circuit 860. While the cascode transistor circuit 860 is illustrated as being implemented using bipolar junction transistor technology, the cascode transistor circuit 860 can be implemented using other technologies, such as for example, FET technology. The cascode transistor circuit 860 includes transistors 862, 864 and 866. The collector terminal of the transistor 851 in the current source 850 is coupled to the emitter of the transistor 862 in the cascode transistor circuit 860. Similarly, the collector terminal of the transistor 852 in the current source 850 is coupled to the emitter of the transistor 864 in the cascode transistor circuit 860 and the collector terminal of the transistor 854 in the current source 850 is coupled to the emitter of the transistor 866 in the cascode transistor circuit 860. The collector terminal of the transistor 866 is coupled to a supply voltage, Vcc. The collector terminal of the transistor 862 is coupled to connection 868 (RFp) and the collector terminal of the transistor 864 is coupled to the connection 869 (RFm). The RF current signals from the LNA 802 are supplied on connections 871 and 872. In this example, one of the differential signals is supplied on connection 871 and the other differential signal is supplied on connection 872; however, this designation is arbitrary.

Both differential signals supplied by the LNA 802 pass through the cascode transistor circuit 860 and are supplied on connections 868 and 869 to the differential inputs of the mixer 700. In this embodiment, the subharmonic mixer 700 is shown as operate on the in-phase (I) signal component. In practice, the receiver 800 would operate on both the in-phase (I) and the quadrature-phase (Q) signals.

The LO phase generator 330 (described above) supplies offset phase LO signals to the subharmonic mixer 700. In this example, the LO phase generator supplies 0, 90, 180 and 270 degree offset LO signals to the subharmonic mixer 700. By supplying the offset phase LO signals in the LO path, polyphase filters are eliminated from the RF path. Eliminating polyphase filters from the RF path removes the associated loss from the RF path that would degrade the noise performance of the receiver and minimizes the amount of die area used by the RF components. In addition, placing the mixer phase shift in the LO path instead of the RF path minimizes the RF voltage amplitude, which further improves the IP2 performance of the receiver.

The output of the subharmonic mixer 700 is supplied as differential signals on connections 874 and 875 to output circuitry 970. The output circuitry is a schematic representation of one of the low pass filters 481 and 482 of FIG. 4. The output circuitry 870 includes cascode transistors 878 and 879 that receive a bias signal, Bias_CSCD, on their respective gate terminals. A capacitor 881 is located across the output connections OUTp and OUTm. The output circuitry 870 also includes resistors 882 and 884, transistors 886 and 887 and resistors 888 and 889. The output OUTp is one of the differential baseband in-phase signals (BBIp) and the output OUTm is the other differential baseband in-phase signal (BBm).

While various embodiments of the invention have been described, it will be apparent to those of ordinary skill in the art that many more embodiments and implementations are possible that are within the scope of this invention.

What is claimed is:

1. A differential radio frequency (RF) receiver, comprising:
   a fully differential direct conversion receive chain;
   a subharmonic mixer in the receive chain, the subharmonic mixer configured to receive a differential radio frequency (RF) input signal and a local oscillator (LO) signal that is phase-shifted by a nominal 45 degrees;
   a synthesizer having a voltage controlled oscillator and having at least one frequency divider to generate desired receive LO signals;
   fully differential low noise amplifiers in the receive chain, the fully differential low noise amplifiers configured to provide no voltage gain to the received RF signal; and
   direct current (DC) blocking capacitors between the low noise amplifiers and the subharmonic mixer, the DC blocking capacitors configured to provide a low impedance to the subharmonic mixer and to fold radio frequency (RF) current to the subharmonic mixer.

2. The receiver of claim 1, in which the subharmonic mixer is configured to downconvert from radio frequency (RF) to baseband receive signals in a plurality of communication bands.

3. The receiver of claim 1, in which the synthesizer further comprises a phase combiner configured to develop the 45 degree nominally phase-shifted LO signals from a single voltage controlled oscillator (VCO).

4. The receiver of claim 1, in which the synthesizer is configured to develop in phase and quadrature-phase modulator LO signals from a single voltage controlled oscillator (VCO) using only frequency dividers.

5. The receiver of claim 1, further comprising a resistive load shared among the low noise amplifiers.

6. A transceiver comprising:
   a fully differential direct conversion receiver;
   a subharmonic mixer configured to operate using phase shifted local oscillator (LO) signals; the subharmonic mixer configured to receive a radio frequency (RF) input signal and a local oscillator (LO) signal that is phase-shifted by a nominal 45 degrees;
   a synthesizer comprising a voltage controlled oscillator and has at least one frequency divider to generate desired transmit and receive LO signals;
   a transmitter comprising a harmonic rejection modulator, a use thereof made possible by a frequency plan designed to allow the synthesizer to develop transmit and receive LO signals without a frequency multiplier; and
   direct current (DC) blocking capacitors between low noise amplifiers and the subharmonic mixer in the fully differential direct conversion receiver, the DC blocking capacitors configured to provide a low impedance to the subharmonic mixer and to fold radio frequency (RF) current to the subharmonic mixer.

7. The transceiver of claim 6, wherein the transmitter further comprises a variable gain amplifier, and wherein the gain characteristic of the variable gain amplifier is a soft step function.

8. The transceiver of claim 7, wherein the low noise amplifiers further comprise fully differential low noise amplifiers in the receiver, the fully differential low noise amplifiers configured to provide no voltage gain to the received signal.

9. The transceiver of claim 8, in which the subharmonic mixer is configured to downconvert from radio frequency (RF) to baseband receive signals in a plurality of communication bands.

10. The transceiver of claim 8, in which the synthesizer further comprises a phase combiner configured to develop the 45 degree nominally phase-shifted LO signals from a single voltage controlled oscillator (VCO).

11. The transceiver of claim 8, in which the synthesizer is configured to develop in-phase and quadrature-phase modulator LO signals from a single voltage controlled oscillator (YCO) using only frequency dividers.

12. The transceiver of claim 6, further comprising a resistive load shared among the low noise amplifiers.

13. A portable transceiver, comprising:
   a fully differential direct conversion receive chain;
   a subharmonic mixer in the receive chain, the subharmonic mixer configured to receive a differential radio frequency (RF) input signal and a local oscillator (LO) signal that is phase-shifted by a nominal 45 degrees;
   a synthesizer having a voltage controlled oscillator and having at least one frequency divider to generate desired receive LO signals; and
   direct current (DC) blocking capacitors between low noise amplifiers and the subharmonic mixer, the DC blocking capacitors configured to provide a low impedance to the subharmonic mixer and to fold radio frequency (RF) current to the subharmonic mixer; and
   wherein the low noise amplifiers further comprise fully differential low noise amplifiers in the receive chain, the fully differential low noise amplifiers configured to provide no voltage gain to the received signal.

14. The portable transceiver of claim 13, further comprising a resistive load shared among the low noise amplifiers.

* * * * *